United States Patent [19]
Grabbe et al.

[11] Patent Number: 4,623,220
[45] Date of Patent: Nov. 18, 1986

[54] LASER TO FIBER CONNECTION

[75] Inventors: Dimitry Grabbe, Middletown; Iosif Korsunsky, Harrisburg, both of Pa.

[73] Assignee: AMP Incorporated, Harrisburg, Pa.

[21] Appl. No.: 627,148

[22] Filed: Jul. 2, 1984

[51] Int. Cl.[4] .............................................. G02B 6/36
[52] U.S. Cl. .................................. 350/96.20; 357/17; 357/80
[58] Field of Search ............... 350/96.15, 96.17, 96.18, 350/96.20; 250/227, 552; 357/17, 30, 19, 74, 80, 81

[56] References Cited
U.S. PATENT DOCUMENTS

| | | | |
|---|---|---|---|
| 4,065,203 | 12/1977 | Goell et al. | 350/96.20 |
| 4,119,363 | 10/1978 | Camlibel et al. | 350/96.20 |
| 4,296,998 | 10/1981 | Dufft | 350/96.20 |
| 4,523,802 | 6/1985 | Sakaguchi et al. | 350/96.20 X |

FOREIGN PATENT DOCUMENTS

2128768  5/1984  United Kingdom .............. 350/96.20

OTHER PUBLICATIONS

Kuwahara et al., "Efficient and Reflection Insensitive Coupling From . . . ", *Proc. of 6th Eur. Conf. on Opt. Commun.*, Sep. 1980, pp. 191-194.

*Primary Examiner*—John Lee
*Attorney, Agent, or Firm*—Adrian J. LaRue; Frederick W. Raring

[57] ABSTRACT

A device for optically coupling a fiber to a solid state laser is taught. Briefly stated, a fiber is held by a pedestal or holder and, after alignment between the fiber and the laser, the holder is attached to the same mounting platform upon which the laser is also mounted. The holding or attachment material exhibits the same thermal properties as the base material, thereby minimizing any thermal expansion or contraction which would cause misalignment between the fiber and the laser.

2 Claims, 2 Drawing Figures

LASER TO FIBER CONNECTION

BACKGROUND OF THE INVENTION

This invention relates, generally, to the interconnection and alignment between a solid state laser and a optical fiber and, more particularly, to a package as well as a means for accomplishing same.

Attendant with the ever-increasing usage of fiber optics is the increased need and desire to place fiber optic emitters, detectors and connectors into various places which may operate over wide environmental ranges. Coupled with this increased usage is the desire and necessity to optically couple as much light which is produced by an emitter into an optical fiber. A number of schemes such as those found in U.S. Pat. No. 4,362,356 "Concentric Optic Termination Utilizing a Fixture" issued Dec. 7, 1982 to Williams et al; U.S. Pat. No. 4,186,996 "Optic Adaptor Junction" issued Feb. 5, 1980 to Bowen et al; and U.S. Pat. No. 4,178,067 "Splicing Optic Waveguides by Shrinkable Means" issued Dec. 11, 1979 to Johnson et al attempt to minimize loss of optical power through optical mismatching. Additionally, optical mismatch may also occur when light does not emerge from an emitter in a direction strictly parallel to or perpendicular to an edge of a chip or when light is emitted in different directions from emitter to emitter due to manufacturing variations. This problem is particularly acute when laser emitters are utilized. Accordingly, it is advantageous to have a device which allows for alignment between optical emitter and optical fiber on an individualized emitter-to-emitter basis in order to maximize optical coupling. Also, it is desirable to have a device which minimizes environmental effects which may cause misalignment between an emitter and an optical fiber. Further, it is desirable to have a device which provides for captivating a fiber without the use of clamps. Such a device is taught by the present invention.

Accordingly, the present invention teaches as an object of the present invention, a device for aligning an optical fiber with an optical emitter, comprising an optical emitter, an optical fiber, a pedestal having an optical fiber holding aperture therein for fixedly holding the optical fiber therein, the pedestal further having a stem portion adjacent thereto, a support block having disposed thereon the optical emitter and having a well or pedestal retaining area therein which is adjacent the optical emitter, the well or pedestal retaining area having disposed therein the stem portion of the pedestal wherein the cross-sectional area of the well is substantially larger than the cross-sectional area of the pedestal, and a holder mounting material disposed in the well which has a coefficient of thermal expansion which relatively matches the coefficient of thermal expansion of the support block and which secures the stem portion in the pedestal retaining area.

BRIEF DESCRIPTION OF THE DRAWINGS

Reference is now made to the accompanying drawings in which.

DESCRIPTION OF THE PREFERRED EMBODIMENT

Figure 1:
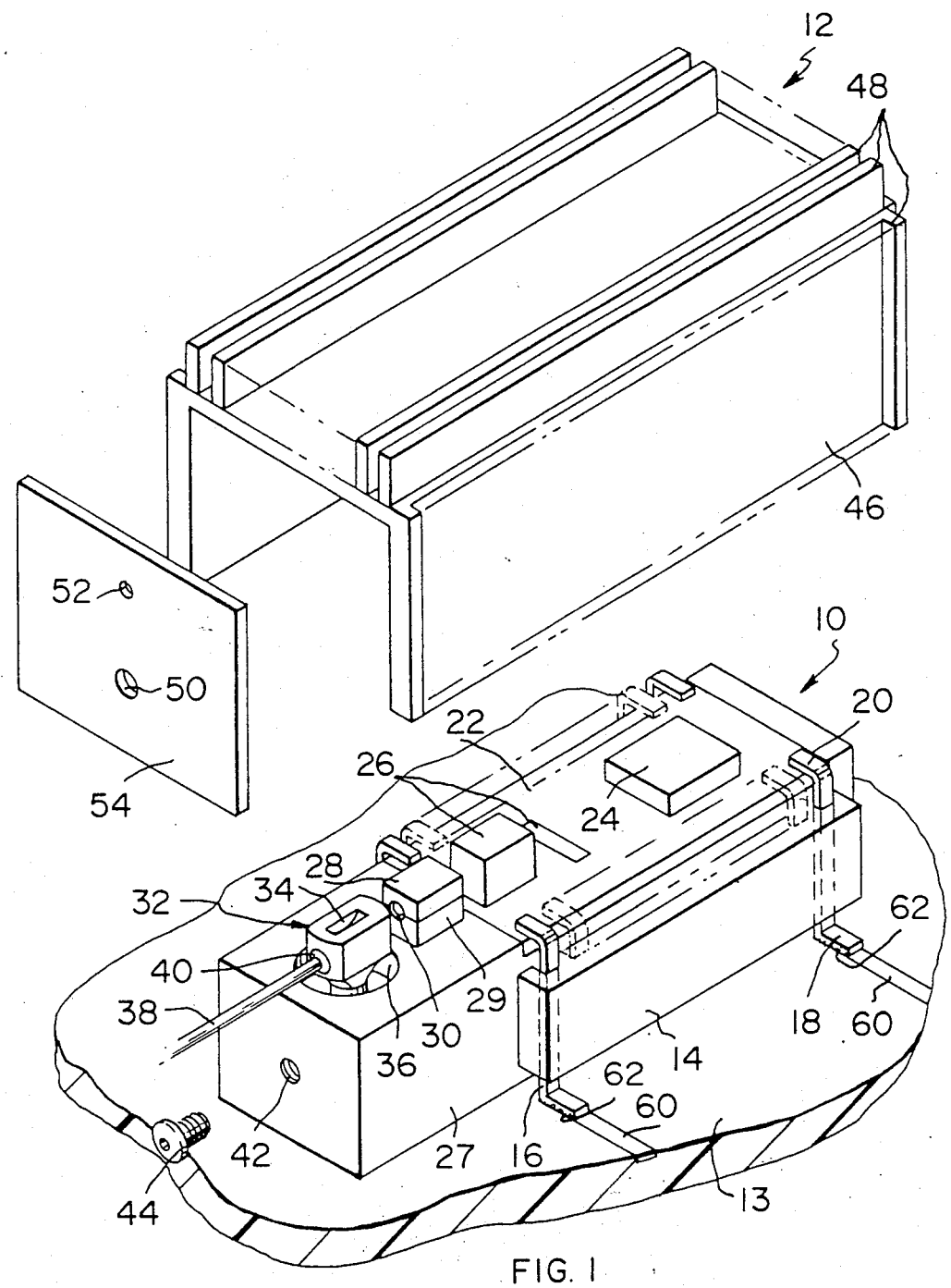
FIG. 1 is an isometric elevational view showing the overall structure of the invention.

Referring now to FIG. 1 there is an isometric elevational view of the package for the present invention. A laser-to-fiber main assembly is shown generally at 10 and would be encased in a cover shown generally at 12. The main assembly 10 is disposed on a system substrate 13. An insulative lead spacing material 14 is utilized to separate the lead midportion 16 and, in the preferred embodiment of the present invention, is plastic although other materials such as ceramic or any other suitably insulative material may be utilized. Surface mounting portions or feet 18 are utilized thereby making the present assembly 10 a surface mounting device although it is to be understood that other arrangements can and may be utilized. A lead upper portion 20 is disposed on the top portion of the assembly 10 and is utilized for interconnecting with various portions of the electronics on the device (shown in more detain in FIG. 2). Disposed on top of the main assembly 10 is a ceramic substrate 22 which has disposed thereon a control chip 24 and a laser output monitor 26. The support block 27, which is preferably made of copper, has disposed thereon the ceramic substrate 22. A laser chip 28 is disposed on top of a diamond 29 with the diamond being used to draw heat from the laser chip. An aperture 30 is disposed adjacent the laser chip 28 for allowing the emitting of light. The diamond 29 is disposed on top of the support block 27 and, since the block 27 is copper, it draws heat from the diamond 29. A holder or pedestal 32 is disposed in a well or pedestal retaining area 36 and has window 34 disposed therein. On one side of the pedestal 32 is a fiber holding aperture 40 with a fiber 38 disposed therein. A threaded aperture 42 (only one shown) is on each end of the support block 27 and is adapted to receive a cover mounting screw 44. The cover 12 is comprised of a main housing 46 and an end piece 54. Cooling fins 48 are disposed on the top of the main housing 46 and aid in the removal of heat. A mounting screw aperture 50 is disposed on each end of the cover 12 and allows the cover 12 to be seated over the entire main assembly 10 as shown more clearly in FIG. 2. An end cover fiber aperture 52 is disposed in the end piece 54 and permits the mounting of the fiber 38.

Figure 2:
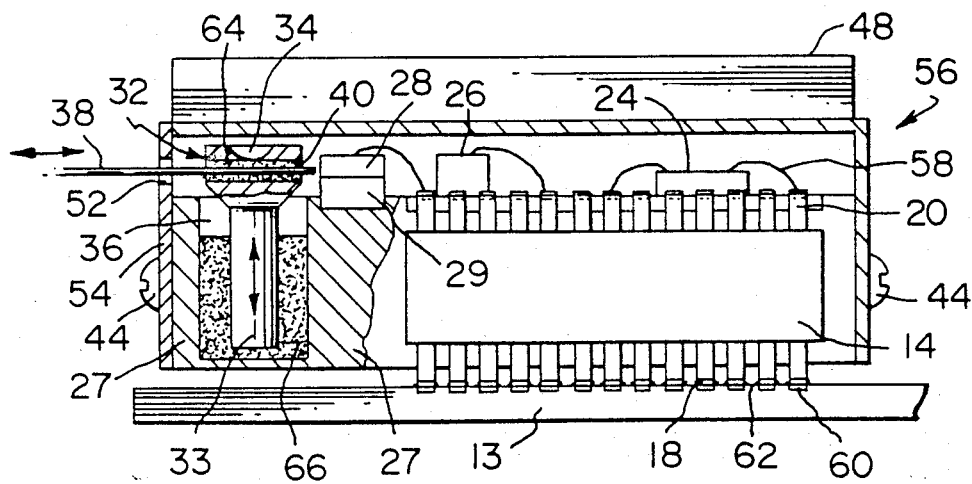
FIG. 2 is a side partly cross-sectional view taken through the lower portion of FIG. 1.

Referring now to FIG. 2 there is shown a side partly cross-sectional view of the present invention. A laser-to-fiber package is shown generally at 56 which is the assembled portions of the main assembly 10 and the cover 12 mounted on the system substrate 13. Here it can be seen how leads 58 interconnect the upper portion of the leads 20 to the control chip 24, laser output monitor 26, or the laser chip 28. To properly align the fiber 38 with the laser aperture 30, an alignment procedure is followed. This procedure requires that a fiber 38 is inserted through the fiber holding aperture 40 into the holder or pedestal 32. The fiber 38 is held in the pedestal 32 by a fiber holding material 64, which thereby eliminates the need for a clamping mechanism between the fiber 38 and pedestal 32. The pedestal 32 is then inserted into the well 36. It should be noted that the pedestal 32 is constructed so as to have a head portion and a stem portion 33 of a substantially reduced cross-section compared to the size of the well 36. Further, the shape of stem 33 of the pedestal 32, in the preferred embodiment of the present invention, has the same shape as the well 36. In this manner, a great deal of stability is obtained for coefficient of expansion purposes in that displacements and forces due to cooling are balanced thereby expanding or contracting in the same direction and at the same rates or amounts. The main assembly 10 is then held in a fixture (not shown) which can provide desired heating or cooling as needed. The pedestal 32 is then clamped with a micro-manipulator which thereby permits positioning of the tip of the fiber 38 in relation to the laser beam produced by the laser chip 28, so as to optimize the optical coupling between the fiber 38 and the laser chip 28. Thereafter, the space in the well 36 between the pedestal 32 and the outside walls of the well 36 is filled with a holder mounting material 66 and which, in the preferred embodiment of the present invention, has a melting point substantially lower than that of the fiber holding material 64. The holder mounting material 66 may be inserted in a number of forms including a shot, slug, or ring. Upon proper alignment between the fiber 38 and the laser chip 28, the holder mounting material 66 is heated to a liquid state and then allowed to cool. In this manner, after the fiber 38 has been held in place by fiber holding material 64 disposed in the window of the pedestal 32, the entire pedestal 32 is positioned in all three directions in the well 36 and is then firmly held in place. In the preferred embodiment of the present invention, the fiber holding material 64 utilizes alloys which are manufactured by Cerro Metal Products of Bellefonte, Pa. and are commonly referred to as Cerrolow/36, Cerrotru, Cerrocast, Cerroseal-35, Cerrodent and Cerrobase. These alloys have an extremely low melting point in the vicinity of 100° Centigrade to approximately 300° Centigrade. These alloys exhibit properties such that they will remain relatively stable upon cooling from its melted condition and thereby do not contract or expand so as to prevent movement of the fiber 38. Similarly, the holder mounting material is also an alloy available from Cerro Metal Products but has a lower melting point than that of the fiber holding material. In this manner, once the fiber 38 has been held in place by the fiber holding material 64 disposed in the window 34, it will not melt upon usage of the holder mounting material 66. Further, the coefficient of expansion properties of the holder mounting material 66 are extremely close to the coefficient of thermal expansion properties of the support block 27. In this manner, whenever the fiber package 56 is subjected to heating or cooling, be it due to the laser and/or external influences, the fiber 38 will move along with the laser chip 28 and thereby allow the fiber 38 and chip 28 to remain in proper alignment for maximum optical coupling.

It is to be understood that many variations may be practiced without departing from the spirit and scope of the present invention. These variations may include different cover or housing configurations which may or may not include cooling fins, while the package itself may be of a DIP type. Different types of alloys may also be used or glass, such as the type found in U.S. Pat. No. 4,314,031 "Tin-Phosphorus Oxyfluoride Glasses" issued Feb. 2, 1982 to Sanford et al, and which is incorporated by reference herein. Further, a fiber holding material which is comprised of an alloy of tin, head, bismuth and silver in a proportion which gives the desired melting point as determined by the other materials may be utilized. Additionally, the pedestal could be inserted into the well when the holder mounting material is in the liquid state. Also, logic or circuit components can be added or eliminated while different lead patterns or arrangements may be used. Further, the well and/or pedestal may be altered into different shapes such as, for example, a star or triangular. Additionally, a fiber optic coupling may be disposed on the end piece for suitable connectorization purposes.

Accordingly, the disclosed invention produces a device for laser to fiber coupling which is relatively inexpensive and simple to practice and which minimizes thermal expansion or contraction properties.

We claim:

1. The combination of a light source (28), an optical fiber (38) which is axially aligned with the light source, and a support for the light source and the fiber, the combination being characterized in that:

the support comprises a support block (27), the light source (28) being mounted on one surface of the support block, the support block having a well (36) extending into the one surface adjacent to the light source (28), a locating and holding pedestal (32) is provided for the fiber, the pedestal having a stem portion (33) which extends into the well (36), the stem portion (33) having a reduced cross section compared to the well (36), the pedestal (32) being held in the well by a first solidified fused material (66) in the well in surrounding relationship to the stem portion (33), the pedestal (32) having a head portion, a fiber holding aperture (40) extending through the head portion, the fiber (38) extending through the aperture (40) and being held therein by a second solidified fused material (64) which is in surrounding relationship to the fiber, the second fused solidified material (64) having a melting point which is higher than the melting point of the first solidified fused material (66).

2. The combination as set forth in claim 1 characterized in that the combination was assembled by first inserting the fiber (38) through the aperture (40), melting and fusing the second material (64), thereafter positioning the stem (33) in the well (36), and thereafter melting and fusing the first material (66).

* * * * *